United States Patent
Jiao et al.

(10) Patent No.: US 9,947,731 B2
(45) Date of Patent: Apr. 17, 2018

(54) ORGANIC LIGHT-EMITTING DISPLAY SUBSTRATE, MANUFACTURING METHOD THEREOF AND DISPLAY DEVICE

(71) Applicant: BOE TECHNOLOGY GROUP CO., LTD., Beijing (CN)

(72) Inventors: Zhiqiang Jiao, Beijing (CN); Wenjun Hou, Beijing (CN); Chinlung Liao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/092,927

(22) Filed: Apr. 7, 2016

(65) Prior Publication Data
US 2016/0365396 A1 Dec. 15, 2016

(30) Foreign Application Priority Data
Jun. 9, 2015 (CN) .......................... 2015 1 0312426

(51) Int. Cl.
*H01L 27/32* (2006.01)
*H01L 51/00* (2006.01)
*H01L 51/56* (2006.01)

(52) U.S. Cl.
CPC ...... *H01L 27/3246* (2013.01); *H01L 51/0005* (2013.01); *H01L 51/56* (2013.01)

(58) Field of Classification Search
CPC .. H01L 27/3246; H01L 51/56; H01L 51/0005
(Continued)

(56) References Cited

U.S. PATENT DOCUMENTS

| 2003/0011304 A1 | 1/2003 | Duineveld et al. |
| 2005/0093441 A1 | 5/2005 | Uhlig et al. |

(Continued)

FOREIGN PATENT DOCUMENTS

| CN | 1462477 A | 12/2003 |
| CN | 1637615 A | 7/2005 |
| CN | 102388673 A | 3/2012 |

OTHER PUBLICATIONS

First Office Action dated May 22, 2017 in corresponding the Chinese Patent Application No. 201510312426.5.

*Primary Examiner* — Fernando L Toledo
*Assistant Examiner* — Adam S Bowen
(74) *Attorney, Agent, or Firm* — Nath, Goldberg & Meyer; Joshua B. Goldberg; Annie J. Kock

(57) ABSTRACT

Disclosed is an organic light-emitting display substrate, including a substrate and a pixel defining layer on the substrate which includes a plurality of dams crisscrossing in a display area of the substrate to define a plurality of pixel units and define the boundary of the display area, wherein the pixel defining layer further includes a groove arranged on a top surface of each dam, the grooves at least define one frame-shaped area, at least one pixel unit is arranged in each frame-shaped area, and the grooves are used for accommodating a solvent when forming an organic light-emitting element by inkjet printing. Also disclosed is a manufacturing method of an organic light-emitting display substrate and a display device. The present invention can improve the film forming effect of a film layer formed on the substrate, so that the brightness of a display image of the display device is more uniform.

14 Claims, 2 Drawing Sheets

(58) Field of Classification Search
USPC .......................................................... 257/40
See application file for complete search history.

(56) References Cited

U.S. PATENT DOCUMENTS

| | | |
|---|---|---|
| 2005/0133802 A1 | 6/2005 | Lee et al. |
| 2007/0157839 A1* | 7/2007 | Kim ..................... G02B 5/003 |
| | | 101/483 |
| 2010/0213827 A1* | 8/2010 | Yoshida .............. H01L 27/3246 |
| | | 313/504 |
| 2013/0099221 A1 | 4/2013 | Kawamura et al. |
| 2014/0206119 A1* | 7/2014 | Kang .................. H01L 51/0005 |
| | | 438/34 |
| 2014/0284588 A1 | 9/2014 | Takeuchi |
| 2016/0043150 A1* | 2/2016 | Wang .................. H01L 27/3246 |
| | | 257/40 |

* cited by examiner

A-A

ORGANIC LIGHT-EMITTING DISPLAY SUBSTRATE, MANUFACTURING METHOD THEREOF AND DISPLAY DEVICE

FIELD OF THE INVENTION

The present invention relates to the field of display technology, and in particular, to an organic light-emitting display substrate, a manufacturing method thereof and a display device.

BACKGROUND OF THE INVENTION

An organic light-emitting display substrate includes a substrate, and an anode electrode layer, a light emitting functional layer and a cathode electrode layer which are arranged on the substrate. In a manufacturing process of an organic light-emitting display substrate, a light emitting functional layer can be formed on an anode electrode layer by inkjet printing. Considering the fluidity of ink, a pixel defining layer is generally arranged in non-pixel areas between the pixel pattern areas in order to reduce overflow of the ink for inkjet printing to adjacent pixel pattern areas. The pixel defining layer is provided with a plurality of openings corresponding to pixel units, and light emitting functional layer ink is spray coated in the openings by inkjet printing.

With regard to equipment including a large-sized organic light emitting display device, generally the size of an inkjet head for inkjet printing cannot be equivalent to the width of a display area due to technical limits. Therefore, the inkjet head needs to repeatedly sweep on a panel for many times so as to accomplish printing the entire panel. After each printing action, the organic solvent in the ink volatilizes to a certain extent, and given the ambiences of the printing area are inconsistent, the volatilization speeds of the organic solvent in the pixel units of the entire printing area are different. Generally, the organic solvent in the pixel unit close to a non-printing area (i.e., the pixel unit at the boundary of the printing area) volatilizes faster, and the organic solvent in the pixel unit away from the non-printing area (i.e., the pixel unit in the interior of the printing area) volatilizes slower, so that the film forming effect at the boundary of the printing area is different from that in the interior of the printing area, and swatch mura is further formed on the lightened panel.

SUMMARY OF THE INVENTION

The object of the present invention is to provide an organic light-emitting display substrate, a manufacturing method thereof and a display device, in order to improve the film forming uniformity of an organic light emitting film and improve the effect of a display image.

The present invention provides an organic light-emitting display substrate, including a substrate and a pixel defining layer arranged on the substrate, an electrode being arranged in the substrate, the pixel defining layer including a plurality of dams crisscrossing in a display area of the organic light-emitting display substrate, the dams crisscrossing to define a plurality of pixel units and define a boundary of the display area, wherein the pixel defining layer further includes a groove arranged on a top surface of each dam, the grooves at least define one frame-shaped area, at least one pixel unit is arranged in each frame-shaped area, and the groove is used for accommodating a solvent when forming an organic light-emitting element by inkjet printing.

Preferably, the grooves define a plurality of frame-shaped areas along the length or width direction of the substrate, and the width of the frame-shaped area is consistent with that of a sprinkler head for inkjet printing.

Preferably, the grooves define a plurality of frame-shaped areas, the number of the frame-shaped areas is the same as that of the pixel units, and one pixel unit is arranged in each frame-shaped area.

Preferably, the groove has a depth of 0.2-1.5 µm.

Preferably, the dam of the pixel defining layer has a height of 0.5-2 µm.

Correspondingly, a manufacturing method of an organic light-emitting display substrate includes:

forming a pattern including a pixel defining layer on a substrate, wherein the pixel defining layer includes a plurality of dams crisscrossing in a display area of the organic light-emitting display substrate, and the dams crisscross to define a plurality of pixel units and define the boundary of the display area;

forming a groove on each dam of the pixel defining layer, wherein the grooves at least define one frame-shaped area, and at least one pixel unit is arranged in each frame-shaped area;

inkjet printing a first solvent in the grooves; and inkjet printing ink in the pixel units to form a film layer of an organic light-emitting element, wherein the ink is formed by dissolving a material of the film layer to be formed in a second solvent, and the material of the first solvent is the same as that of the second solvent.

Preferably, a first sprinkler head is used for inkjet printing the first solvent in the grooves, and a second sprinkler head is used for inkjet printing the ink in the pixel units.

Preferably, the grooves define a plurality of frame-shaped areas along the length or width direction of the substrate, the width of each frame-shaped area is consistent with that of the second sprinkler head, and the step of inkjet printing the ink in the pixel unit includes:

inkjet printing the ink in the pixel units in the frame-shaped areas along the length direction of the frame-shaped areas by the second sprinkler head.

Preferably, the grooves define a plurality of frame-shaped areas, the number of the frame-shaped areas is the same as that of the pixel units, and one pixel unit is arranged in each frame-shaped area.

Preferably, after the step of inkjet printing the ink in the pixel units, the manufacturing method further includes: baking the substrate to evaporate the first solvent and the second solvent.

Preferably, the film layer to be formed includes a hole injection layer, and the ink is hole injection layer ink formed by dissolving a hole injection layer material in the second solvent.

Preferably, the manufacturing method further includes steps of forming a hole transport layer and a light emitting layer, and the step of forming the hole transport layer includes:

inkjet printing a third solvent in the grooves;

inkjet printing hole transport layer ink in the pixel unit, wherein the hole transport layer is formed by dissolving a hole transport layer material in a fourth solvent, and the material of the third solvent is the same as that of the fourth solvent;

baking the substrate to evaporate the third solvent and the fourth solvent;

the step of forming the light emitting layer includes:

inkjet printing a fifth solvent in the grooves;

inkjet printing light emitting layer ink in the pixel units, wherein the light emitting layer ink is formed by dissolving a light emitting layer material in a sixth solvent, and the material of the fifth solvent is the same as that of the sixth solvent; and baking the substrate to evaporate the fifth solvent and the sixth solvent.

Preferably, after the step of forming the light emitting layer, the manufacturing method further includes:

evaporating to form an electron transport layer and an electron injection layer successively.

Correspondingly, the present invention further provides a display device, and the display device includes the above organic light-emitting display substrate provided by the present invention.

In the present invention, the groove is arranged on the top surface of each dam of the pixel defining layer, and the grooves at least define one frame-shaped area. Before inkjet printing the ink in the frame-shaped areas, a solvent having the same material as the solvent in the ink can be inkjet printed in the grooves first. Therefore, when the ink is inkjet printed in the frame-shaped areas defined by the grooves, since the material of the solvent accommodated in the grooves is the same as that of the solvent in the ink, the ambience at the boundaries of the frame-shaped areas is the same as that in the interior thereof, and then the thickness and the density of the film layer formed in the frame-shaped areas after the solvent in the ink is evaporated are more uniform. Accordingly, the overall uniformity of the film layer on the substrate is improved, and the brightness uniformity of the display device is improved.

BRIEF DESCRIPTION OF THE DRAWINGS

The accompany drawings are to provide further understanding of the present invention, which constitute a part of the specification, and are used for explaining the present invention together with the following specific embodiments, but do not limit the present invention. In the accompany drawings.

DETAILED DESCRIPTION OF THE EMBODIMENTS

The specific embodiments of the present invention will be illustrated below in detail in conjunction with the accompany drawings. It should be understood that the specific embodiments described herein are merely used for illustrating and explaining the present invention, rather than limiting the present invention.

Figure 1:
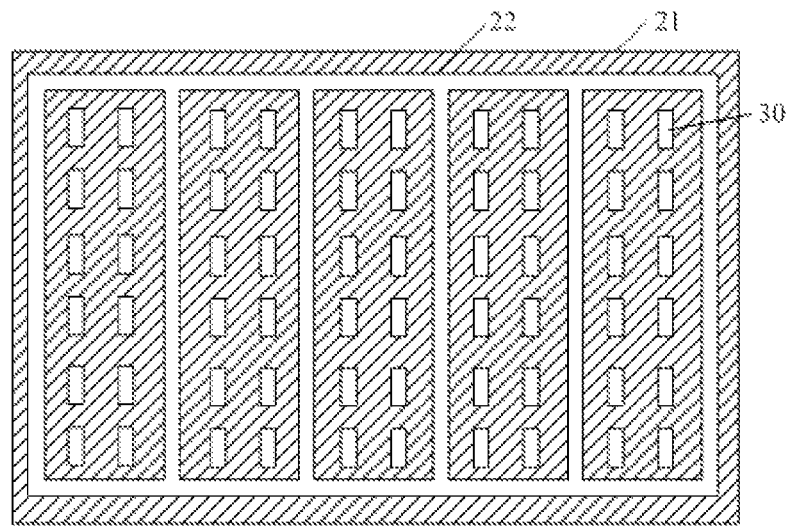
FIG. 1 is a top view of a pixel defining layer in a first embodiment of the present invention.

As one aspect of the present invention, provided is an organic light-emitting display substrate, as shown in FIG. 1, including a substrate 10 and a pixel defining layer arranged on the substrate 10, the pixel defining layer including a plurality of dams 21 crisscrossing in a display area of the organic light-emitting display substrate, the dams 21 crisscrossing to define a plurality of pixel units and define the boundary of the display area, wherein the pixel defining layer further includes a groove 22 arranged on a top surface of each dam 21, the grooves 22 at least define one frame-shaped area, at least one pixel unit 30 is arranged in each frame-shaped area, and the grooves 22 are used for accommodating a solvent when forming an organic light-emitting element by inkjet printing.

In the prior art, when the organic light-emitting element is formed in the pixel units 30 by inkjet printing, a solution formed by dissolving a material of a film layer to be formed in a solvent is inkjet printed in the pixel units, and the film layer is formed after the solvent is evaporated. For example, when a hole injection layer is formed, first, a hole injection layer material is dissolved in a solvent to form hole injection layer ink, the hole injection layer ink is inkjet printed in the pixel units, and then the solvent in the hole injection layer ink can be evaporated by baking or other processes to form the hole injection layer. For all pixel units in each inkjet printing area, the volatile atmosphere above the pixel units close to the middle is relatively thick, and the volatile atmosphere above the pixel units close to the boundary is relatively thin, such that the solvent in the pixel unit closer to the boundary volatilizes faster.

In the present invention, the groove is arranged on the top surface of each dam 21 of the pixel defining layer, and the grooves at least define one frame-shaped area. Before inkjet printing the ink in the frame-shaped area, the solvent having the same material as the solvent in the ink can be inkjet printed in the groove first. For example, when the hole injection layer is formed, a first solvent is inkjet printed in the grooves, and hole injection layer ink formed by dissolving a hole injection layer material in a second solvent is inkjet printed in the pixel units, wherein the material of the first solvent is the same as that of the second solvent. Therefore, when the ink is inkjet printed in the frame-shaped areas defined by the grooves, since the material of the solvent accommodated in the grooves is the same as that of the solvent in the ink, the ambience at the boundaries of the frame-shaped areas is the same as that in the interior thereof, so that the thickness and the density of the film layer formed in the frame-shaped areas after the solvent in the ink is evaporated are more uniform, accordingly, the overall uniformity of the film layer on the substrate is improved, and the brightness uniformity of the display device is improved.

A plurality of pixel units are located in the display area of the organic light-emitting display substrate, the pixel defining layer not only includes the dams formed in the display area, but also includes dams forming the periphery of the display area. The shapes of the frame-shaped areas defined by the grooves 22 are not limited in the present invention. For example, the grooves 22 define one frame-shaped area around the display area, all pixel units in the display area are located in this frame-shaped area. In this arrangement mode, when the width of the inkjet printing sprinkler head is consistent with that of the display area, after the sprinkler head spray coats all the pixel units along the length direction of the display area at one time, the volatilization speed of the solvent in the pixel units located at the boundary of the frame-shaped area is the same as that of the solvent in the pixel units located in the middle of the frame-shaped area, so that the consistency of the film forming effects at different positions on the entire substrate is improved, and a swatch mura phenomenon around the display area when displaying an image is prevented.

However, during actual inkjet printing, the width of the sprinkler head is usually smaller than that of the display area, the ink cannot be inkjet printed in all the pixel units at one time, so it needs to carry out inkjet printing multiple times by the sprinkler head. And the width of the inkjet print area each time is consistent with that of the sprinkler head.

Correspondingly, as shown in FIG. 1, in the present invention, the grooves 22 define a plurality of frame-shaped areas along the length or width direction of the substrate 10, the width of the frame-shaped areas is consistent with that of the sprinkler head for inkjet printing. And during the inkjet printing, the sprinkler head inkjet prints into one frame-shaped area each time. Generally, since the solvent in the ink volatizes easily, before the sprinkler head carries out inkjet printing next time, the solvent in the pixel units previously inkjet printed has started to volatize. However, in the present invention, as the solvent is also accommodated in the grooves at the boundary of each frame-shaped area, the consistency of the ambience in the interior of each frame-shaped area and the ambience at the boundary thereof is improved, thus the consistency of the volatilization speeds of a second solvent at different positions in each frame-shaped area is improved, and then the thicknesses and the density of the film layer formed in the pixel units in the interior of the frame-shaped area and in the pixel units at the boundary thereof are more consistent to prevent swath mura when a display panel displays an image.

Figure 2:
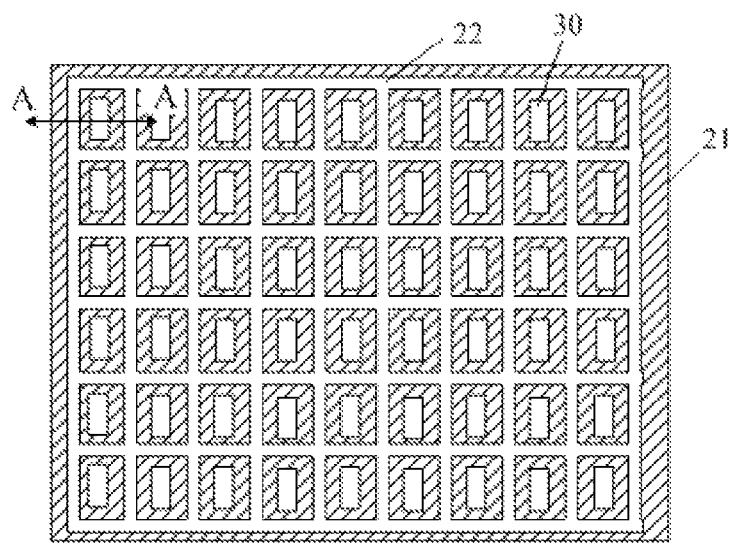
FIG. 2 is a top view of a pixel defining layer in a second embodiment of the present invention.
Figure 3:
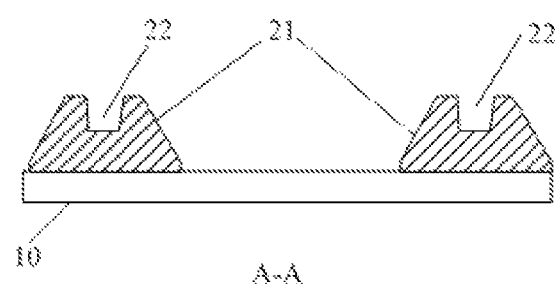
FIG. 3 is a sectional view of FIG. 2 in an AA direction.

Preferably, as shown in FIGS. 2 and 3, the grooves define a plurality of frame-shaped areas, the number of the frame-shaped areas is the same as that of the pixel units, and one pixel unit 30 is arranged in each frame-shaped area. Therefore, with regard to any pixel unit 30, it is surrounded by the first solvent, so that the ambience in the interior of the pixel unit 30 is consistent with that at the boundary thereof, so that the volatilization speeds of the solvent at different positions of the pixel unit are consistent, the thickness and the density distribution of the formed film layer are more uniform, and the generation of coffee rings in the pixel units is reduced, therefore the light emitting effect of each pixel unit is better.

Specifically, in the present invention, the depth of the grooves 22 is 0.2-1.5 µm, thus after the solvent is accommodated in the grooves, the ambience in the interior of the areas defined by the grooves is more consistent with that at the boundary thereof, and then the thicknesses and the density distribution of the film layer formed in all the pixel units in the area are more uniform.

Specifically, the height of the dams 21 of the pixel defining layer is 0.5-2 µm, to prevent the ink from flowing between adjacent pixel units, and meanwhile, the thickness of the organic light-emitting display substrate will not be influenced.

The organic light-emitting display substrate further includes a thin film transistor and a pixel electrode (not shown in the figures) and other structures.

Figure 4:
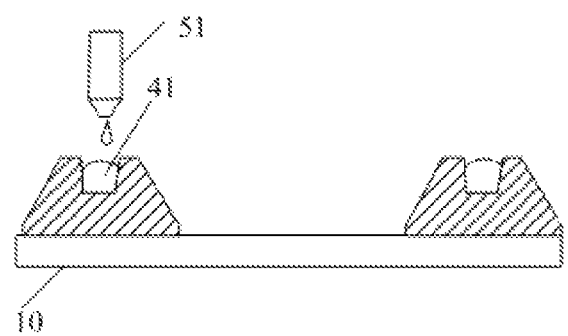
FIG. 4 is a schematic diagram of inkjet printing a first solvent in a groove.
Figure 5:
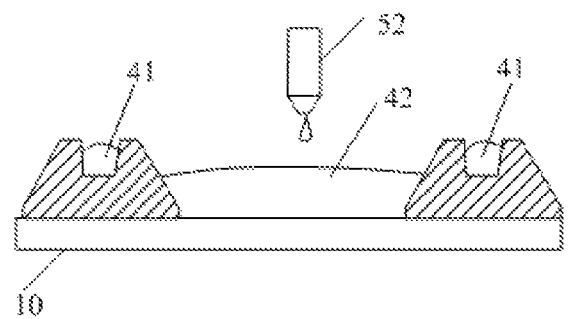
FIG. 5 is a schematic diagram of inkjet printing ink in a pixel unit.

As another aspect of the present invention, a manufacturing method of an organic light-emitting display substrate is provided, including:

forming a pattern including a pixel defining layer on a substrate 10, wherein the pixel defining layer includes a plurality of dams 21 crisscrossing in a display area of the organic light-emitting display substrate, and the dams 21 crisscross to define a plurality of pixel units and define the boundary of the display area;

meanwhile or subsequently, forming a groove 22 on each dam of the pixel definition layer, wherein the grooves 22 at least define one frame-shaped area, and at least one pixel unit is arranged in each frame-shaped area;

inkjet printing a first solvent 41 (as shown in FIG. 4) in the grooves 22; and inkjet printing ink 42 in the pixel units to form a film layer of an organic light-emitting element (as shown in FIG. 5), wherein the ink 42 is formed by dissolving a material of the film layer to be formed in a second solvent, and the material of the first solvent 41 is the same as that of the second solvent.

The pattern including the pixel defining layer can be formed on the substrate 10 by a photolithographic patterning process. The step specifically includes:

forming a pixel defining material layer constituting the pixel defining layer; the pixel defining material layer may be an inorganic material layer, for example, an oxide layer of silicon, a nitride layer of silicon or the like, and also an organic material layer, for example, a photoresist layer or the like.

When the pixel defining material layer is an inorganic material layer, the step of forming the pattern including the pixel defining layer further includes: forming a photoresist layer on the pixel defining material layer, and exposing and developing the photoresist layer to remove the photoresist corresponding to the pixel units; then removing the part of the pixel definition material layer covered with no photoresist through an etching process; and finally, stripping off the rest photoresist to form the pattern including the pixel defining layer.

When the pixel defining material layer is a photoresist layer, the step of forming the pattern including the pixel defining layer further includes: exposing and developing the photoresist layer to remove the photoresist corresponding to the pixel units, so as to directly form the pattern including the pixel defining layer.

Similarly, the dams 21 and the grooves 22 located on the top surface of the dams can be formed by the pixel defining layer by the same photolithographic patterning process. The pixel defining layer 21 and the grooves 22 may also be simultaneously formed by a one-time photolithographic patterning process. Taking it as an example that the material constituting the pixel defining layer is a negative photoresist, the photoresist is exposed with the use of a halftone mask, so that the photoresist corresponding to a light-tight area of the halftone mask is removed after development, the photoresist corresponding to a semi-transparent area and a transparent area of the halftone mask is retained, and the thickness of the photoresist corresponding to the semi-transparent area is smaller than that of the photoresist corresponding to the transparent area, thus forming the dam of the pixel defining layer and the groove located on the top surface of the dam.

In the present invention, the sequence of the step of inkjet printing the first solvent in the grooves and the step of inkjet printing the ink in the pixel units is not particularly limited, preferably, the step of inkjet printing the first solvent in the grooves is carried out before the step of inkjet printing the ink in the pixel units, or the two steps are synchronously carried out. In this way, after the ink 42 is inkjet printed in the pixel units, the second solvent in the ink 42 volatizes, since the first solvent 41 having the same material as the second solvent is accommodated in the grooves 22, the ambience above the pixel units at the boundary of the area is consistent with the ambience above the pixel units in the interior of the area, such that the volatilization speed of the second solvent in the entire area is more uniform, and then the uniformity of the film layer formed after the second solvent is evaporated is improved.

For the convenience of spray coating, a first sprinkler head 51 is used for inkjet printing the first solvent 41 in the grooves, and a second sprinkler head 52 is used for inkjet printing the ink 22 in the pixel units. Actually, a plurality of nozzles are arranged on the sprinkler head of inkjet printing equipment, so that inkjet printing in the plurality of pixel units can be carried out at the same time. And the first sprinkler head 51 and the second sprinkler head 52 in the figure are merely schematic illustration and do not represent specific structures of the sprinkler heads.

As mentioned above, with the development of large-sized display devices and the limitation of the inkjet printing equipments, the width of the sprinkler head for spray coating cannot reach the width of the substrate, and it needs multiple times of inkjet printing so as to ink print the ink to all the pixel units. Specifically, the grooves 22 define a plurality of frame-shaped areas along the length or width direction of the substrate 10, the width of each frame-shaped area is consistent with that of the second sprinkler head, and the step of inkjet printing the ink in the pixel units includes:

inkjet printing the ink in the pixel units in the frame-shaped area along the length direction of the frame-shaped area by the second sprinkler head.

Since the first solvent 41 is accommodated in the grooves 22, the originally thin ambience at the boundary of the frame-shaped area becomes relatively thick, so the ambience of the entire frame-shaped area can be kept consistent, and then the thickness and the density of the film layer formed in the frame-shaped area are more uniform.

Preferably, the grooves define a plurality of frame-shaped areas, the number of the frame-shaped areas is the same as that of the pixel units, and one pixel unit is arranged in each frame-shaped area.

Further, after the step of inkjet printing the ink in the pixel units, the manufacturing method further includes: baking the substrate to evaporate the first solvent 41 and the second solvent in the ink to form the film layer in the pixel units.

Specifically, the film layer to be formed includes a hole injection layer, and the ink is hole injection layer ink formed by dissolving a hole injection layer material in the second solvent.

Further, the organic light-emitting element may further include a hole transport layer and a light emitting layer, the manufacturing method may further include steps of forming the hole transport layer and the light emitting layer. And to prevent the phenomenon that the film layer is non-uniform when the hole transport layer and the light emitting layer are formed by inkjet printing, the step of forming the hole transport layer includes:

inkjet printing a third solvent in the grooves;
inkjet printing hole transport layer ink in the pixel units, wherein the hole transport layer is formed by dissolving a hole transport layer material in a fourth solvent, and the material of the third solvent is the same as that of the fourth solvent;
baking the substrate to evaporate the third solvent and the fourth solvent to form the hole transport layer in the pixel units.

The step of forming the light emitting layer includes:
inkjet printing a fifth solvent in the grooves;
inkjet printing light emitting layer ink in the pixel units, wherein the light emitting layer ink is formed by dissolving a light emitting layer material in a sixth solvent, and the material of the fifth solvent is the same as that of the sixth solvent; and
baking the substrate to evaporate the fifth solvent and the sixth solvent to form the light emitting layer in the pixel units.

Those skilled in the art can understand that, when the hole injection layer and the hole transport layer are inkjet printed, the second solvent for dissolving the hole injection layer material and the fourth solvent for dissolving the hole transport layer material are different. For example, one of the second solvent and the fourth solvent is a polar solvent, and the other is a non-polar solvent, in this way, the fourth solvent in the hole transport layer ink will not dissolve the formed hole injection layer when the hole transport layer ink is inkjet printed.

The organic light-emitting element in the pixel units further includes an electron transport layer and an electron injection layer. After the step of forming the light emitting layer, carrying out evaporating to form the electron transport layer and the electron injection layer successively.

Forming the electron transport layer and the electron injection layer by an evaporation process can prevent the mutual influence on the light emitting layer and improve the manufacturing efficiency in the mass manufacturing process.

The manufacturing method of the present invention may further include a step of forming a thin film transistor and a pixel electrode before forming the pixel definition layer, so that the ink of the film layer to be formed is inkjet printed on the pixel electrode in the upcoming inkjet printing.

As a third aspect of the present invention, a display device is provided, and the display device includes the above organic light-emitting display substrate of the present invention.

Since the grooves are arranged on the dams of the pixel defining layer in the organic light-emitting display substrate provided by the present invention, and the grooves are used for accommodating the solvent when the film layer of the light emitting element is formed by inkjet printing, for example, the hole injection layer ink formed by dissolving the hole injection layer material in the second solvent is inkjet printed in the pixel units, and the first solvent having the same material as the second solvent is inkjet printed in the grooves, the ambience at the boundaries of the frame-shaped areas defined by the grooves is consistent with the ambience in the interior of the frame-shaped areas, thus the volatilization speeds of the second solvent in the pixel units at different positions are consistent, such that the thickness and the density of the film layer formed after the solvent in the ink is evaporated are more uniform, and then the display brightness of the display device is more uniform.

It can be understood that the above embodiments are merely exemplary embodiments used for illustrating the principle of the present invention, but the present invention is not limited thereto. Those of ordinary skill in the art can make a variety of modifications and improvements without departing from the spirit and essence of the present invention, and these modifications and improvements shall also be covered by the protection scope of the present invention.

The invention claimed is:

1. An organic light-emitting display substrate, comprising a substrate and a pixel defining layer arranged on the substrate, the pixel defining layer comprising a plurality of dams crisscrossing in a display area of the organic light-emitting display substrate, the dams crisscrossing to define a plurality of pixel units and define the boundary of the display area, wherein the pixel defining layer further comprises a groove arranged on a top surface of each dam, the grooves at least define one frame-shaped area, at least one pixel unit is arranged in each frame-shaped area, and the grooves are used for accommodating a solvent when an organic light-emitting element is formed by inkjet printing.

2. The organic light-emitting display substrate of claim 1, wherein the grooves define a plurality of frame-shaped areas along the length or width direction of the substrate, and the width of the frame-shaped areas is consistent with that of a sprinkler head for inkjet printing.

3. The organic light-emitting display substrate of claim 1, wherein the grooves define a plurality of frame-shaped areas, a number of the frame-shaped areas are the same as that of the pixel units, and one pixel unit is arranged in each frame-shaped area.

4. The organic light-emitting display substrate of claim 1, wherein the grooves has a depth of 0.2-1.5 µm.

5. The organic light-emitting display substrate of claim 1, wherein the dam of the pixel defining layer has a height of 0.5-2 µm.

6. A display device, comprising the organic light-emitting display substrate of claim 1.

7. A manufacturing method of an organic light-emitting display substrate, comprising:
   forming a pattern including a pixel defining layer on a substrate, wherein the pixel defining layer comprises a plurality of dams crisscrossing in a display area of the organic light-emitting display substrate, and the dams crisscross to define a plurality of pixel units and define the boundary of the display area;
   forming a groove on each dam of the pixel defining layer, wherein the grooves at least define one frame-shaped area, and at least one pixel unit is arranged in each frame-shaped area;
   inkjet printing a first solvent in the grooves; and
   inkjet printing ink in the pixel units to form a film layer of an organic light-emitting element, wherein the ink is formed by dissolving a material of the film layer to be formed in a second solvent, and the material of the first solvent is the same as that of the second solvent.

8. The manufacturing method of claim 7, wherein a first sprinkler head is used for inkjet printing the first solvent in the grooves, and a second sprinkler head is used for inkjet printing the ink in the pixel units.

9. The manufacturing method of claim 8, wherein the grooves define a plurality of frame-shaped areas along the length or width direction of the substrate, the width of each frame-shaped area is consistent with that of the second sprinkler head, and the step of inkjet printing the ink in the pixel units comprises:
   inkjet printing the ink in the pixel units in the frame-shaped areas along the length direction of the frame-shaped areas by the second sprinkler head.

10. The manufacturing method of claim 7, wherein the grooves define a plurality of frame-shaped areas, the number of the frame-shaped areas is the same as that of the pixel units, and one pixel unit is arranged in each frame-shaped area.

11. The manufacturing method of claim 7, wherein after the step of inkjet printing the ink in the pixel units, the manufacturing method further comprises: baking the substrate to evaporate the first solvent and the second solvent.

12. The manufacturing method of claim 7, wherein the film layer to be formed comprises a hole injection layer, and the ink is hole injection layer ink formed by dissolving a hole injection layer material in the second solvent.

13. The manufacturing method of claim 12, wherein the manufacturing method further comprises steps of forming a hole transport layer and a light emitting layer, and the step of forming the hole transport layer comprises:
   inkjet printing a third solvent in the grooves;
   inkjet printing hole transport layer ink in the pixel units, wherein the hole transport layer is formed by dissolving a hole transport layer material in a fourth solvent, and the material of the third solvent is the same as that of the fourth solvent;
   baking the substrate to evaporate the third solvent and the fourth solvent;
   the step of forming the light emitting layer comprises:
   inkjet printing a fifth solvent in the grooves;
   inkjet printing light emitting layer ink in the pixel units, wherein the light emitting layer ink is formed by dissolving a light emitting layer material in a sixth solvent, and the material of the fifth solvent is the same as that of the sixth solvent; and
   baking the substrate to evaporate the fifth solvent and the sixth solvent.

14. The manufacturing method of claim 13, wherein after the step of forming the light emitting layer, the manufacturing method further comprises:
   evaporating to form an electron transport layer and an electron injection layer successively.

* * * * *